United States Patent
Ma et al.

(10) Patent No.: US 8,917,132 B2
(45) Date of Patent: Dec. 23, 2014

(54) APPARATUSES, METHODS, AND CIRCUITS INCLUDING A DELAY CIRCUIT

(71) Applicant: Micron Technology, Inc., Boise, ID (US)

(72) Inventors: Yantao Ma, Boise, ID (US); Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/793,627

(22) Filed: Mar. 11, 2013

(65) Prior Publication Data

US 2014/0253198 A1    Sep. 11, 2014

(51) Int. Cl.
   *H03H 11/26*    (2006.01)

(52) U.S. Cl.
   CPC .................................. *H03H 11/265* (2013.01)
   USPC ............................ 327/276; 327/298; 327/261

(58) Field of Classification Search
   USPC ................................................ 327/298, 276
   See application file for complete search history.

(56) References Cited

U.S. PATENT DOCUMENTS

| | | | |
|---|---|---|---|
| 6,952,123 B2 * | 10/2005 | Kizer et al. | 327/147 |
| 7,078,949 B2 | 7/2006 | Kim et al. | |
| 7,176,734 B2 | 2/2007 | Park | |
| 7,884,659 B2 * | 2/2011 | Jang et al. | 327/231 |
| 7,961,017 B2 | 6/2011 | Lee | |
| 8,106,694 B2 | 1/2012 | Kim | |
| 8,149,034 B2 | 4/2012 | Gomm | |
| 2003/0179027 A1 * | 9/2003 | Kizer et al. | 327/158 |
| 2003/0218486 A1 * | 11/2003 | Kwak | 327/158 |
| 2004/0189363 A1 | 9/2004 | Takano | |
| 2007/0147564 A1 * | 6/2007 | Fan et al. | 375/355 |
| 2008/0063125 A1 * | 3/2008 | Chatwin | 375/355 |
| 2010/0164571 A1 * | 7/2010 | Jang et al. | 327/158 |
| 2014/0002155 A1 * | 1/2014 | Park et al. | 327/158 |

* cited by examiner

*Primary Examiner* — Ryan Jager
(74) *Attorney, Agent, or Firm* — Dorsey & Whitney LLP

(57) ABSTRACT

Apparatuses, methods, and delay circuits for delaying signals are described. An example apparatus includes a fine delay circuit configured to provide an output signal based on a ratio of a first input signal and a second input signal. The fine delay circuit including a phase mixer circuit including first signal drivers configured to receive the first input signal. The fine delay circuit further including second signal drivers configured to receive the second input signal, where at least two of the first signal drivers have different drive strengths and at least two of the second signal drivers have different drive strengths.

19 Claims, 4 Drawing Sheets

APPARATUSES, METHODS, AND CIRCUITS INCLUDING A DELAY CIRCUIT

TECHNICAL FIELD

Embodiments of the disclosure relate generally to delay circuits, and more particularly, in one or more of the illustrated embodiments, to delay circuits having a linear duty cycle.

DESCRIPTION OF RELATED ART

Delay circuits are designed to delay a signal by a delay, which may be adjustable for some delay circuits, for example, often to adjust the timing between clock signals. For example, a delay circuit may be controlled to adjust the delay until the two clock signals are synchronized. Conventional delay circuits have a coarse delay circuit and a fine delay circuit. The coarse delay circuit may have a series of delay stages that are coupled together serially and configured to provide an output signal from any particular delay stage to provide a desired coarse delay. The fine delay circuit may be configured to supplement the coarse delay with a fine delay to provide an output signal. Generally, the fine delay circuit can adjust a fine delay amount to generate an output signal by increasing or decreasing a number of fine delay steps. Conventional fine delay circuits, however, may exhibit duty cycle step variations and non-uniform delay step sizes (and/or increments). As clock frequencies increase, duty cycle step variance and non-uniform delay step sizes may cause issues with reliability and robustness in circuitry to which the output signal is provided from the delay circuit.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
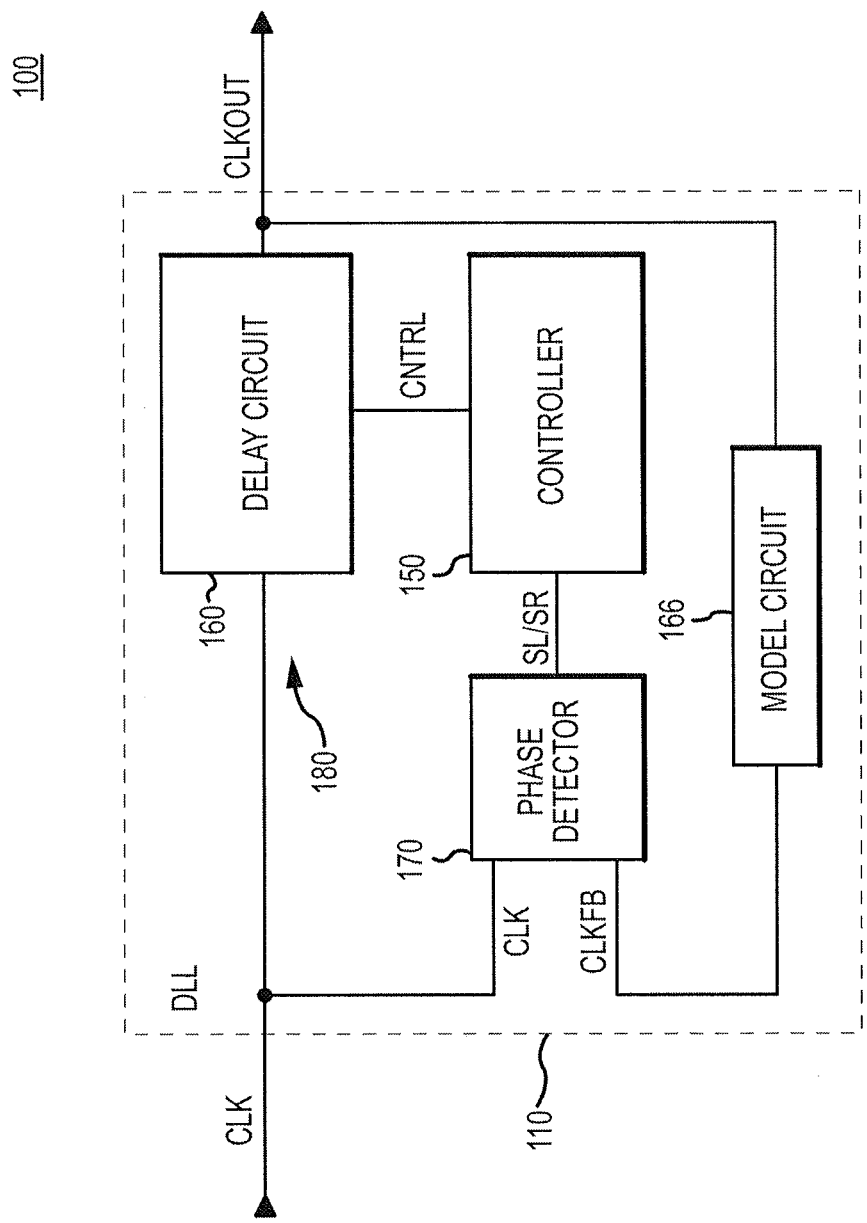
FIG. 1 is a block diagram of a particular illustrative embodiment of an apparatus including a delay-locked loop.

Referring to FIG. 1, a particular illustrative embodiment of an apparatus including a delay-locked loop (DLL) is disclosed and generally designated 100. As used herein, examples of apparatuses may include an integrated circuit, a memory device, a memory system, an electronic device or system, a smart phone, a tablet, a computer, a server, etc. The apparatus 100 may include a DLL circuit 110, which includes a delay circuit 160. The delay circuit 160 may receive an input signal CLK and apply a delay to the CLK signal to provide an output signal CLKOUT. The delay circuit 160 may include a coarse delay circuit coupled to a fine delay circuit that, together, delay the CLK signal to provide the CLKOUT signal. In some embodiments, the coarse delay circuit may provide two output signals to the fine delay circuit, with one of the two signals lagging the other signal by a step size of the coarse delay circuit. The fine delay circuit may provide the CLKOUT signal by mixing the two signals received from the coarse delay circuit. As will be described in more detail below, the fine delay circuit may be configured to generate the CLKOUT signal having reduced duty cycle error and improved fine delay step uniformity as compared with conventional fine delay circuits by using signal drivers having differing drive strengths.

The delay of the delay circuit 160 may be adjusted based on a comparison between a phase of a feedback signal CLKFB (e.g., the CLKOUT delayed by a model circuit 166) and a phase of the CLK signal at a phase detector 170. The phase detector 170 provides signals SL/SR to a controller 150 that are indicative of a difference between the phases of the CLKFB and CLK signals. Responsive to the SL/SR signals, the controller 150 provides control signals CNTRL to control the delay circuit 160 to adjust the delay. The controller 150 may include a shift register that is used to provide the CNTRL signals to control the delay circuit 160 based on the SL/SR signals. For example, in an embodiment, the controller 150 provides control signals that control the delay circuit to decrease the number of active delay stages responsive to an active SL signal (e.g., "shift left"), and as a result, decrease the delay of the delay circuit 160. The controller 150 may provide control signals that control the delay circuit to increase the number of active delay stages, for example, responsive to an active SR signal (e.g., "shift right"), and as a result, increase the delay of the delay circuit 160.

The CLKOUT signal is provided to a model circuit 166, which further delays the CLKOUT signal to provide the CLKFB signal. The model circuit 166 may model a propagation delay of at least a portion of the circuitry (not shown) of the apparatus 100, for example, an output buffer, an input buffer, a signal distribution network, and/or other circuits.

In operation, the controller 150 may control the delay circuit 160 to adjust the delay based on a phase relationship between the CLK signal and the CLKFB signal. For example, the phase detector 170 is configured to detect a phase difference between the CLK signal and the CLKFB signal (e.g., the CLKOUT signal delayed through the model circuit 166). Based on a detected phase difference, the phase detector 170 may provide the SL/SR signals to reduce the phase difference. Detecting a phase difference and providing the SL/SR signal is repeated to synchronize (e.g., in phase with each other) the CLK and the CLKFB signals. In an embodiment, the SL/SR signal may include a shift right (SR) signal and/or a shift left (SL) signal. In other embodiments, signals other than shift signals may be provided by the phase detector 170 to indicate a phase difference between the CLK and CLKFB signals.

The controller 150 may provide control signals CNTRL responsive to the SL/SR signals to control the delay circuit 160 to adjust the delay applied to the CLK signal. For example, when shifting to the left, the delay circuit 160 may be configured to include fewer active delay stages of the coarse delay circuit, which may decrease the coarse delay applied to the CLK signal. Alternatively, when shifting to the right, the controller 150 controls the delay circuit 160 to include more active delay stages of the coarse delay circuit, which may increase the coarse delay applied to the CLK signal. As previously discussed, the coarse delay circuit may provide two signals to a fine delay circuit of the delay circuit 160 that are delayed relative to one another by a delay through a single delay stage of the coarse delay circuit. The fine delay circuit may apply a fine delay to the two signals by mixing the two signals to provide the CLKOUT signal.

In an embodiment, the fine delay circuit may include signal drivers having differing drive strengths. In another embodiment, the fine delay circuit may include base signal drivers that generate a base signal from which the CLKOUT signal is provided. The ability of the delay circuit 160 to mix the two signals received from the coarse delay circuit through the fine delay circuit using signal drivers having different drive strengths and/or base signal drivers providing a base signal in providing the CLKOUT signal may reduce duty cycle error and may improve fine delay step uniformity. By adjusting the delay applied to the CLK signal, the timing of the CLKFB signal is adjusted accordingly. When the CLK and CLKFB signals are synchronized, for example, the phase detector 170 may provide SL/SR signals that maintain the delay through the delay circuit 160.

Figure 2:
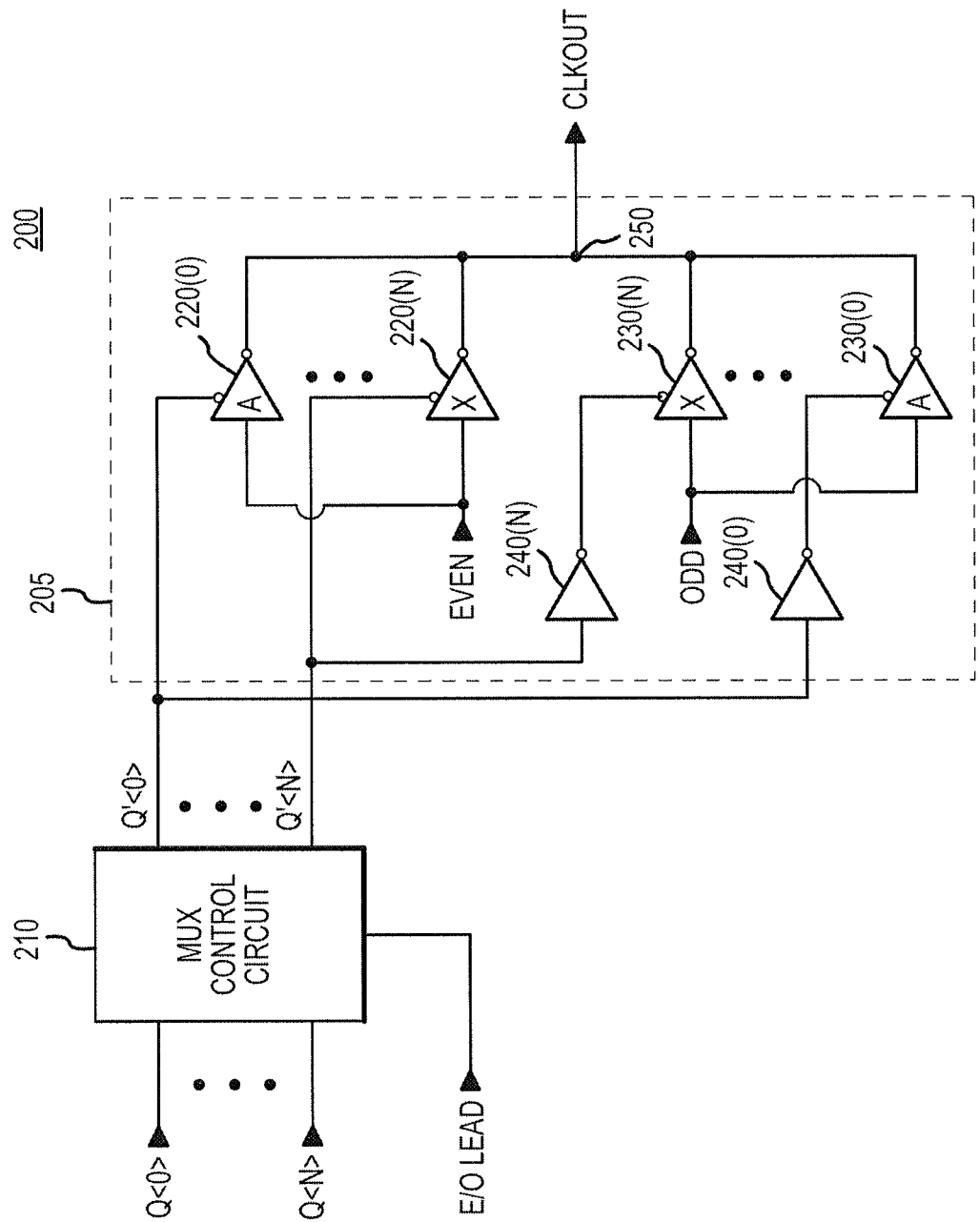
FIG. 2 is a block diagram of a particular illustrative embodiment of a fine delay circuit having a phase mixer.

Referring to FIG. 2, a particular illustrative embodiment of a fine delay circuit having a phase mixer circuit 205 is disclosed and generally designated 200. The delay circuit 160 of FIG. 1 may include the fine delay circuit 200 of FIG. 2. The phase mixer circuit 205 may be configured to mix a first signal EVEN and a second signal ODD through first signal drivers 220(0-N) and second signal drivers 230(0-N) based on respective multiplexer control signals Q'<0-N> to provide an output signal CLKOUT. In some embodiments, the EVEN signal and the ODD signal may be delayed relative to one another by approximately a delay of a single coarse delay stage of a coarse delay circuit, with either the EVEN signal leading the ODD signal or the ODD signal leading the EVEN signal. A multiplexer control circuit MUX CONTROL CIRCUIT 210 may be configured to receive input control signals Q<0-N> and provide the Q'<0-N> signals to respective signal drivers of the first signal drivers 220(0-N) and the second signal drivers 230(0-N) based on an even/odd lead signal E/O LEAD. The first signal drivers 220(0-N) and second signal drivers 230(0-N) may be activated based on the respective Q'<0-N> signals. The first signal drivers 220(0-N) may have differing drive strengths and the second signal drivers 230(0-N) may have differing drive strengths. A drive strength of a driver may be related to an amount of power a respective driver is capable of providing at an output. The differing drive strengths of the first and second signal drivers 220(0-N) and 230(0-N), which along with the MUX CONTROL CIRCUIT 210, may provide the CLKOUT signal which has low duty cycle delay step variance and relatively uniform delay steps sizes as compared with conventional fine delay circuits.

While FIG. 2 depicts two first signal drivers 220(0-N) and two second signal drivers 230(0-N), the fine delay circuit may include any number of first signal drivers and second signal drivers, where a number of signal drivers may be related to a step size of the phase mixer. For example, including more signal drivers may produce finer (e.g., smaller) step sizes of the phase mixer circuit 205 and including less signal drivers may produce coarser (e.g., larger) step sizes of the phase mixer 205. Thus, a number of steps to transition from timing associated with the EVEN signal to timing associated with the ODD signal is based on a number of signal drivers corresponding to each of the EVEN signal and the ODD signal. For example, if there are two of each of the first signal drivers 220(0-N) and the second signal drivers 230(0-N), the step size associated with each signal driver is half of the timing difference between the EVEN signal and the ODD signal. If there are four of each of the first signal drivers 220(0-N) and the second signal drivers 230(0-N), the step size associated with each signal driver is one-fourth of the timing difference between the EVEN signal and the ODD signal.

The MUX CONTROL CIRCUIT 210 may be configured to receive input control signals Q<0-N> signals and to provide the Q'<0-N> signals based on values of the Q<0-N> signals and further based on a value of the E/O LEAD signal. As explained above, the EVEN signal and the ODD signal may be delayed relative to one another by approximately a delay of a single coarse delay stage of a coarse delay circuit, and the E/O LEAD signal may be configured to indicate which of the EVEN signal or the ODD signal is leading.

The phase mixer circuit 205 may include the first signal drivers 220(0-N) and the second signal drivers 230(0-N). Each of the first signal drivers 220(0-N) may be configured to receive the EVEN signal at an input and a respective Q'<0-N> signal to control a respective output. Each of the second signal drivers 230(0-N) may be configured to receive the ODD signal at an input, and a respective Q'<0-N> signal, which has been inverted via a respective driver control inverter 240(0-N), to control a respective output. The outputs of each of the first signal drivers 220(0-N) and each of the second signal drivers 230(0-N) may be coupled to an output node 250 to provide the CLKOUT signal.

As explained above, the first signal drivers 220(0-N) may be made up of signal drivers having two or more different drive strengths. Similarly, the second signal drivers 230(0-N) may be made up of signal drivers having two or more different drive strengths. In some embodiments, a respective first signal driver 220(0-N) and a respective second signal driver 230(0-N) that are controlled by a common respective Q'<0-N> signal may have equal drive strengths. For example, the first signal driver 220(0) and the second signal driver 230(0) may each have a drive strength represented by "A." Further, the first signal driver 220(N) and the second signal driver 230(N) may each have a drive strength represented by "X."

In some embodiments, the drive strengths of the first signal drivers 220(0-N) may be scaled to start with a smallest drive strength "A" at the first signal driver 220(0), where a drive strength of each successive first signal driver 220(1-N) increases as compared to a previous first signal driver with the first signal driver 220(N) having a largest drive strength "X." In other embodiments, drive strengths of the first signal drivers 220(0-N) may be scaled to decrease from "A" to "X." Further, drive strengths of the first signal drivers 220(0-N) may include any combination of drive strengths, such as similar drive strengths on each of the first signal drivers 220(0-N) except a first few and a last few first signal drivers. For example, a first subset of the first signal drivers 220(0-N) may have one or more different drive strengths, a middle subset of the first signal drivers 220(0-N) may have a common drive strength, and a remaining subset of the first signal drivers 220(0-N) may have one or more different drive strengths. Although previously described with respect to the first signal drivers 220(0-N), the previous examples of drive strength configuration may be applied in addition or alternatively to the second signal drivers 230(0-N).

In an embodiment, the drive strengths of each of the first signal drivers 220(0-N) and each of the second signal drivers 230(0-N) may be fixed. For example, the drive strength may be fixed based on a p-n ratio of the transistors included in each of the first signal drivers 220(0-N) and each of the second signal drivers 230(0-N). In another embodiment, the drive strengths of each of the first signal drivers 220(0-N) and each of the second signal drivers 230(0-N) may be configurable. For example, the drive strength may be controlled based on a number of active transistors included in each of the first signal drivers 220(0-N) and each of the second signal drivers 230(0-N).

During operation, the MUX CONTROL CIRCUIT 210 may be configured to receive the Q<0-N> signals and the E/O LEAD signal from a controller, such as the controller 150 of FIG. 1. The MUX CONTROL CIRCUIT 210 may be configured to provide the Q'<0-N> signals to the phase mixer circuit 205. The MUX CONTROL CIRCUIT 210 may be configured to map the Q<0-N> signals to the Q'<0-N> signals based on a value of the E/O LEAD signal. Collectively, the Q'<0-N> signals may be used to control a portion of the EVEN signal and a portion of the ODD signal that are mixed together via the phase mixer circuit 205 to provide the CLKOUT signal. In some embodiments, when the E/O LEAD signal has a value indicating that the EVEN signal is leading, the MUX CONTROL CIRCUIT 210 may be configured to map the Q<0-N> signals directly to the Q'<0-N> signals with no multiplexing (e.g., Q<0> is mapped to Q'<0>, Q<1> is mapped to Q'<1>, ... Q<N> is mapped to Q'<N>). Further, when the E/O LEAD signal has a value indicating that the ODD signal is leading, the MUX CONTROL CIRCUIT 210 may be configured to map the Q<0-N> signals to the Q'<0-N> signals with full multiplexing or partial multiplexing. Full multiplexing may include mapping the Q<0-N> to the Q'<0-N> signals in an inverted order (e.g., Q<0> is mapped to Q'<N>, Q<1> is mapped to Q'<N−1>, ... Q<N−1> is mapped to Q'<1>, and Q<N> is mapped to Q'<0>). Partial multiplexing may include mapping a first subset of the Q<0-N> signals to a last subset of the Q'<0-N> signals in an inverted order (e.g., Q<0> is mapped to Q'<N> and Q<1> is mapped to Q'<N−1>), mapping a middle subset of the Q<0-N> signals directly to a middle subset of the Q'<0-N> signals (e.g., Q<3> is mapped to Q'<3> ... Q<N−2> is mapped to Q'<N−2>), and mapping a last subset of the Q<0-N> signals to a first subset of the Q'<0-N> signals in an inverted order (e.g., Q<N−1> is mapped to Q'<1> and Q<N> is mapped to Q'<0>). It will be appreciated the first subset, the middle subset, and the last subset may have any combination of sizes.

Each Q'<0-N> signal represents a phase mixer step, and the mapping to the respective Q<0-N> signals controls an activation/deactivation order of the first signal drivers 220(0-N) and the second signal drivers 230(0-N). In some embodiments, each Q'<0-N> signal may control a single first signal driver of the first signal drivers 220(0-N) and a single second signal driver of the second signal drivers 230(0-N), with the single second signal driver receiving an inverted respective Q'<0-N> signal via the respective driver control inverter 240 (0-N). Thus, a state of the single first signal driver may be complementary to a state of the single second signal driver (e.g., when the single first signal driver is active, the single second signal driver is inactive, and when the single first signal driver is inactive, the single second signal driver is active).

As explained above, the phase mixer circuit 205 may receive the EVEN signal and the ODD signal at the first signal drivers 220(0-N) and the second signal drivers 230(0-N), respectively. A number of active first signal drivers 220(0-N) as compared with a number of active second signal drivers 230(0-N), as controlled by the respective Q'<0-N> signals, may determine an approximate ratio of the EVEN signal to the ODD signal that is used by the phase mixer circuit 205 to provide the CLKOUT signal. The first signal drivers 220(0-N) and the second signal drivers 230(0-N) may have different drive strengths. Thus, an order in which the first signal drivers 220(0-N) are activated/deactivated and an order in which the second signal drivers 230(0-N) are deactivated/activated may affect uniformity of a phase mixer step size. In some embodiments, the first signal drivers 220(0-N) may be activated and/or deactivated starting with the first signal driver 220(0-N) having the smallest drive strength. Further, the second signal drivers 230(0-N) may be activated and/or deactivated starting with the second signal driver 230(0-N) having the smallest drive strength. Thus, because a controller (e.g., the controller 150 of FIG. 1) may be indifferent to the relative drive strength sizes of the first signal drivers 220(0-N) and the second signal drivers 230(0-N), the MUX CONTROL CIRCUIT 210 may be configured to map the Q'<0-N> signals from the Q<0-N> signals, as explained above, to the first signal drivers 220(0-N) and the second signal drivers 230(0-N) based on whether the EVEN signal is leading or the ODD signal is leading. In some embodiments, the first signal drivers 220(0-N) and the second signal drivers 230(0-N) may be activated and/or deactivated in a sequence that provides improved step size uniformity and improved duty cycle linearity as compared with circuits having signal drivers with equal drive strengths.

In a specific example, when all of the Q'<0-N> signals are set to a logical high value, each of the first signal drivers 220(0-N) are active, and each of the second signal drivers 230(0-N) are inactive, and the phase mixer 210 may provide the CLKOUT signal based on the EVEN signal, with no input from the ODD signal. In a first phase mixer step, (e.g., when the Q'<0> signal is set to a logical low value), a respective first signal driver of the first signal drivers 220(0-N) (e.g., having the smallest drive strength) is deactivated and a respective second signal driver of the second signal drivers 230(0-N) is activated, and the phase mixer 210 may provide the CLKOUT signal based on a ratio of N−1 to 1 of the EVEN signal to the ODD signal. With each successive phase mixer step (e.g., as each successive Q'<0-N> signal is changed to a logical low value), respective first signal drivers 220(0-N) may be deactivated (e.g., in increasing order of drive strength) and respective second signal drivers 230(0-N) may be activated (e.g., in increasing order of drive strength), and the phase mixer 210 may provide the CLKOUT having a ratio that continues to be driven by less of the EVEN signal and more of the ODD signal. When all of the Q'<0-N> signals are set to a logical low value, each of the first signal drivers 220(0-N) may be inactive, and each of the second signal drivers 230(0-N) may be active, and the phase mixer 210 may provide the CLKOUT signal based on the ODD signal, with no input from the EVEN signal. As indicated, the above example is a specific example, and the Q'<0-N> signals may be set to logical high values and/or logical low values in any combination, and the first and second signal drivers 220(0-N) and 230(0-N) may be activated and deactivated with the opposite logical values of the Q'<0-N> signals than previously described.

The different drive strengths the first signal drivers 220(0-N) and the second signal drivers 230(0-N) of the phase mixer circuit 205, as well as a sequence in which the first signal drivers 220(0-N) and the second signal drivers 230(0-N) are activated and/or deactivated, may provide phase mixer steps having increased uniformity as compared with phase mixer steps of a phase mixer having signal drivers with equal drive strengths. Further, the different step sizes and activation/deactivation sequence may also improve duty cycle linearity across phase change steps as compared with a phase mixer circuit having signal drivers with equal drive strength.

Figure 3:
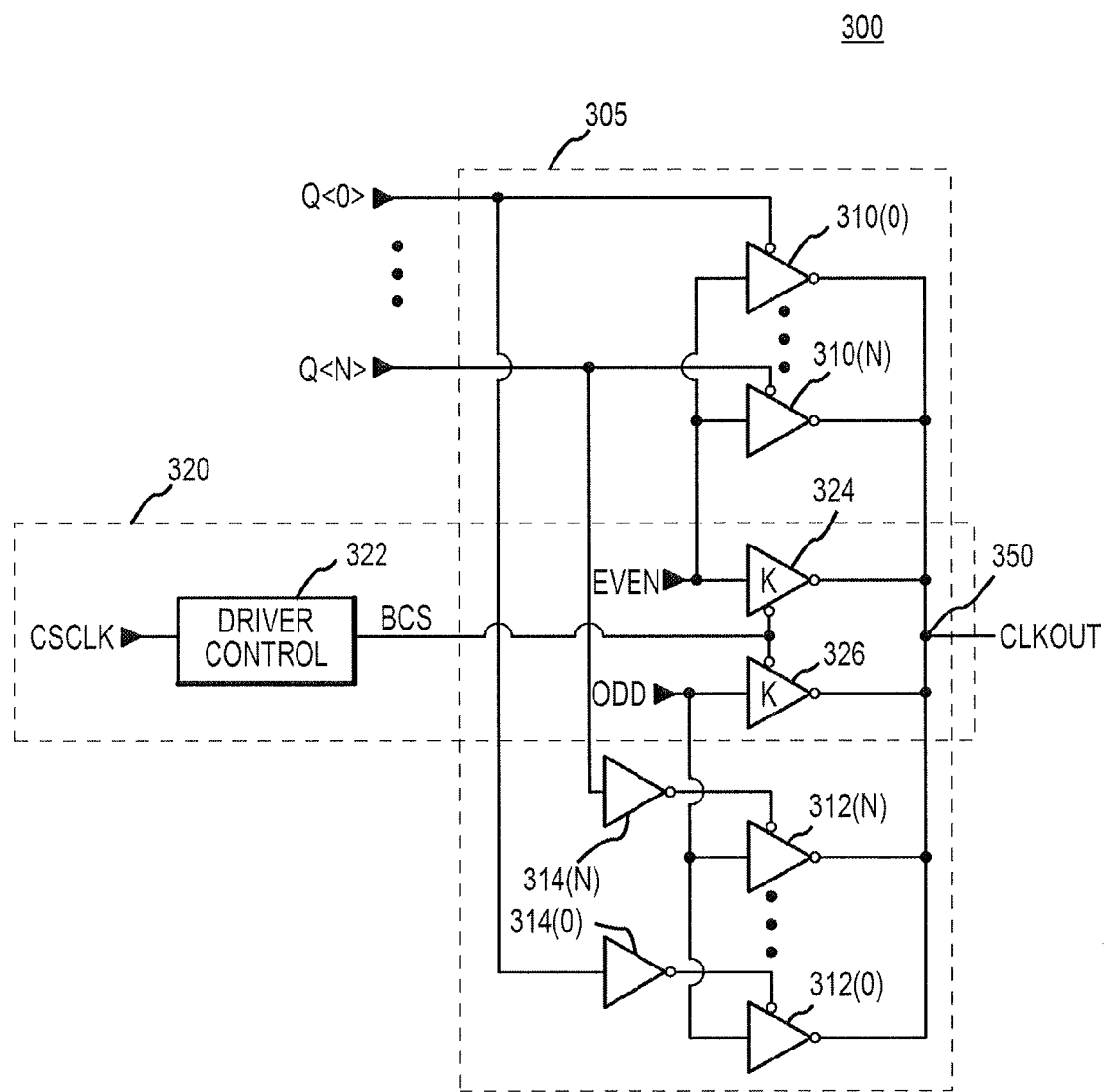
FIG. 3 is a block diagram of a particular illustrative embodiment of a fine delay circuit having a phase mixer.

Referring to FIG. 3, a particular illustrative embodiment of a fine delay circuit having a phase mixer circuit 305 is disclosed and generally designated 300. The delay circuit 160 of FIG. 1 may include the fine delay circuit 300 of FIG. 3. The phase mixer circuit 305 may be configured to mix a first signal EVEN and a second signal ODD through first signal drivers 312(0-N) and second signal drivers 314(0-N) based on control signals Q<0-N>, and through base signal drivers 324 and 326 of a base interpolation circuit 320 to provide an output signal CLKOUT. As explained with reference to FIG. 2, the EVEN signal and the ODD signal may be delayed relative to one another by approximately a delay of a single coarse delay stage of a coarse delay circuit, with either the EVEN signal leading the ODD signal or the ODD signal leading the EVEN signal. The Q<0-N> signals may be configured to activate respective first signal drivers 312(0-N) and/or respective second signal drivers 314(0-N).

The phase mixer circuit 305 may include the first signal drivers 312(0-N) and the second signal drivers 314(0-N). Each of the first signal drivers 312(0-N) are configured to receive the EVEN signal at an input and a respective Q<0-N> signal to control a respective output. Each of the second signal drivers 314(0-N) may be configured to receive the ODD signal at an input, and a respective Q<0-N> signal, which has been inverted via a respective driver control inverter 340(0-N), to control a respective output. The outputs of each of the first signal drivers 312(0-N) and each of the second signal drivers 314(0-N) may be coupled to the output node 350 to provide the CLKOUT signal. In some embodiments, each of the first signal drivers 312(0-N) may have equal drive strengths and each of the second signal drivers 314(0-N) may have equal drive strengths. In a specific embodiment, drive strengths of the first signal drivers 312(0-N) may be equal to drive strengths of the second signal drivers 314(0-N). In an another embodiment, the first signal drivers 312(0-N) and the second signal drivers 314(0-N) may have differing drive strengths as described with reference to the first signal drivers 220(0-N) and the second signal drivers 230(0-N) of FIG. 2.

The base interpolation circuit 320 may include the base signal drivers 324 and 326 and the base driver control circuit 322. The base driver control circuit 322 may be configured to receive a coarse shift clock signal CSCLK. The CSCLK signal may indicate whether the coarse delay circuit is adjusting a delay (e.g., activating or deactivating a delay stage). The base driver control circuit 322 may be configured to provide a base control signal BCS to the base signal drivers 324 and 326 having a value based on a value of the CSCLK signal. The first base signal driver 324 and the second base signal driver 326 may be configured to provide the EVEN signal and the ODD signal, respectively, to an output node 350.

In some embodiments, the first base signal driver 324 may have lower drive strength than drive strengths of the first signal drivers 312(0-N). Additionally, the second base signal driver 326 may have a lower drive strength than drive strengths of the second signal drivers 314(0-N). The base signals drivers 324 and 326 having lower drive strengths and providing the EVEN signal and the ODD signal, respectively, independent of the Q<0-N> signals may provide a base signal from which the CLKOUT signal is provided. The base signal may provide the CLKOUT signal having a low duty cycle delay step variance and relatively uniform delay steps sizes as compared with conventional fine delay circuits. While FIG. 3 depicts two first signal drivers 312(0-N) and two second signal drivers 314(0-N), the fine delay circuit may include any number of first signal drivers and second signal drivers, where a number of signal drivers may be related to a step size of the phase mixer.

During operation, the base interpolation circuit 320 may be configured to provide the EVEN signal and the ODD signal having a one-to-one ratio to the output node 350 (e.g., a base signal) based on a value of the BCS signal to the base signal drivers 324 and 326. The value of the BCS signal may be controlled based on a value of the CSCLK signal. For example, the base driver control circuit 322 may be configured to assert the BCS signal responsive to the CSCLK signal being deasserted, and to de-assert the BCS signal responsive to the CSCLK signal being asserted. The EVEN signal and the ODD signal may be received at the first base signal driver 324 and the second base signal driver 326. Responsive to the BCS signal being asserted, the first base signal driver 324 and the second base signal driver 326 may be configured to provide the EVEN signal and the ODD signal (e.g., the base signal drivers 324 and 326 are activated), respectively, to the output node 350 (e.g., the base signal). Further, responsive to the BCS signal being deasserted, the first base signal driver 324 and the second base signal driver 326 may be configured to discontinue provision of the EVEN signal and the ODD signal (e.g., the base signal drivers 324 and 326 are deactivated), respectively, to the output node 350 (e.g., no base signal). Thus, the base interpolation circuit 320 may be configured to mask the EVEN signal and the ODD signal from the output node 350 during time periods associated with the coarse delay circuit adjusting a delay to avoid mixing glitches during a timing transition of either of the EVEN signal or the ODD signal. A time length of application of the mask may be equal to an exit tree delay of the coarse delay circuit. In other embodiments, the fine delay circuit 300 may be configured to provide EVEN signal and the ODD signal via the base signal drivers 324 and 326 to the output node 350 (e.g., the base signal) during time periods associated with a delay adjustment of the coarse delay circuit (e.g., the base signal drivers 324 and 326 are always activated).

Further, similar to the phase mixer circuit 205 of FIG. 2, the phase mixer circuit 305 may receive the EVEN signal and the ODD signal at the first signal drivers 312(0-N) and the second signal drivers 314(0-N), respectively. The first signal drivers 312(0-N) and the second signal drivers 314(0-N) may be controlled based on a respective Q<0-N> signals. In some embodiments, each Q<0-N> signal may control a single first signal driver of the first signal drivers 312(0-N) and a single second signal driver of the second signal drivers 314(0-N), with the single second signal driver receiving an inverted respective Q<0-N> signal via the respective driver control inverter 340(0-N). Thus, a state of the single first signal driver may be complementary to a state of the single second signal driver (e.g., when the single first signal driver is active, the single second signal driver is inactive, and when the single first signal driver is inactive, the single second signal driver is active). A number of active first signal drivers 312(0-N) as compared with a number of active second signal drivers 314(0-N) may determine an approximate ratio of the EVEN signal to the ODD signal that is used by the phase mixer circuit 305 to provide the CLKOUT signal from the base signal.

As explained above, in some embodiments, the base signal drivers 324 and 326 may have different drive strengths than the first signal drivers 312(0-N) and the second signal drivers 314(0-N). For example, the first base signal driver 324 (and/or the second base signal driver 326) may have a drive strength that is between 0.3 and 2 times a drive strength of an first signal driver of the first signal drivers 312(0-N) (and/or an second signal driver of the second signal drivers 314(0-N). In a specific embodiment, the drive strength of the first base signal driver 324 is approximately half of a drive strength of an first signal driver of the first signal drivers 312(0-N), and the drive strength of the second base signal driver 326 is approximately half of a drive strength of an second signal driver of the second signal drivers 314(0-N). In an embodiment, the base signal drivers 324 and 326 may have equal drive strengths.

Providing the EVEN signal and the ODD signal to the output node 350 via the base signal drivers 324 and 326 may provide a base signal having a timing that is approximately halfway between a timing of the EVEN signal and the ODD signal and a baseline phase. Thus, adjustment of the base signal to provide the CLKOUT signal starting from the timing and phase of the base signal via the first signal drivers 312(0-N) and the second signal drivers 314(0-N) may reduce duty cycle error between steps of the phase mixer caused by phase inconsistencies of the signal drivers, and may improve uniformity of phase mixer steps as compared with a phase mixer without the base interpolation circuit 320.

Additionally, aspects of the fine delay circuit 200 of FIG. 2 may be combined with aspects of the fine delay circuit 300 of FIG. 3. For example, the fine delay circuit 200 of FIG. 2 may be modified to include the base interpolation circuit 320 of FIG. 3. Further, the fine delay circuit 300 of FIG. 3 may be modified to include the phase mixing circuit 205 with signal drivers having different drive strengths and the MUX CONTROL CIRCUIT 210 of FIG. 2. Further, the delay circuit 160 of FIG. 1 may include a combination of the fine delay circuit 200 of FIG. 2 and the fine delay circuit 300 of FIG. 3.

Figure 4:
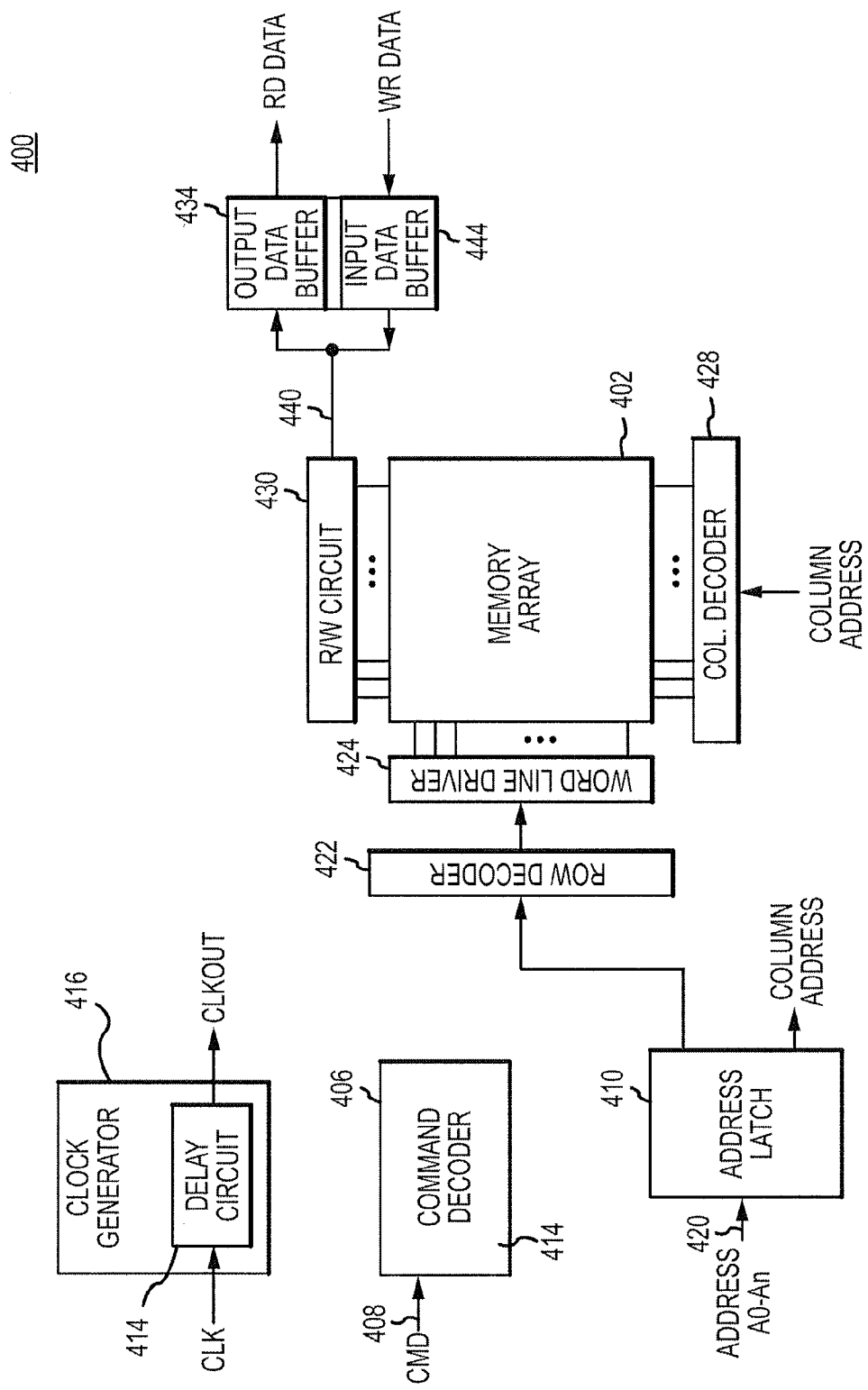
FIG. 4 is a block diagram of a memory including a delay circuit according to an embodiment of the disclosure.

Referring to FIG. 4, block diagram of a memory 400 including a delay circuit according to an embodiment of the invention. The memory 400 may include an array 402 of memory cells, which may be, for example, dynamic random-access memory (DRAM) memory cells, static random-access memory (SRAM) memory cells, flash memory cells, or some other types of memory cells. The memory 400 includes a command decoder 406 that may receive memory commands through a command bus 408 and provide (e.g., generate) corresponding control signals within the memory 400 to carry out various memory operations. For example, the command decoder 406 may respond to memory commands provided to the command bus 408 to perform various operations on the memory array 402. In particular, the command decoder 406 may be used to provide internal control signals to read data from and write data to the memory array 402. Row and column address signals may be provided (e.g., applied) to an address latch 410 in the memory 400 through an address bus 420. The address latch 410 may then provide (e.g., output) a separate column address and a separate row address.

The address latch 410 may provide row and column addresses to a row address decoder 422 and a column address decoder 428, respectively. The column address decoder 428 may select bit lines extending through the array 402 corresponding to respective column addresses. The row address decoder 422 may be connected to a word line driver 424 that activates respective rows of memory cells in the array 402 corresponding to received row addresses. The selected data line (e.g., a bit line or bit lines) corresponding to a received column address may be coupled to a read/write circuitry 430 to provide read data to an output data buffer 434 via an input-output data path 440. Write data may be provided to the memory array 402 through an input data buffer 444 and the memory array read/write circuitry 430.

The memory 400 may include a clock generator 416 that includes a delay circuit 414. The delay circuit 414 provides an output clock signal CLKOUT signal that may be used for clocking circuitry of the memory 400. The delay circuit 414 may include the DLL 110 of FIG. 1, the fine delay circuit 200 of FIG. 2, the fine delay circuit 300 of FIG. 3, or any combination thereof.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
    a fine delay circuit configured to provide an output signal based on a ratio of a first input signal and a second input signal, the fine delay circuit comprising a phase mixer circuit, the phase mixer circuit comprising first signal drivers configured to receive the first input signal and further comprising second signal drivers configured to receive the second input signal, wherein at least two of the first signal drivers have different drive strengths and at least two of the second signal drivers have different drive strengths, wherein the fine delay circuit further comprises a multiplexing control circuit configured to receive a plurality of control signals and to provide a plurality of multiplexed control signals, wherein a mapping of individual ones of the plurality of multiplexed control signals relative to individual drivers of the first drivers and to individual drivers of the second drivers is based on which of the first input signal and the second input signal is leading.

2. The apparatus of claim 1, wherein the multiplexing control circuit is configured to control the first signal drivers and the second signal drivers based on the plurality of multiplexed control signals.

3. The apparatus of claim 2, wherein a multiplexed control signal of the plurality of multiplexed control signals is provided to a respective first signal driver of the first signal drivers, wherein the multiplexed control signal is further provided to a respective second signal driver of the second signal drivers via an inverter.

4. The apparatus of claim 3, wherein the respective first signal driver and the respective second signal driver have an equal drive strength.

5. The apparatus of claim 2, wherein the multiplexing control circuit is configured to receive an even/odd leading signal wherein the even odd signal indicates which of the first input signal or the second input signal is leading, wherein values of the plurality of multiplexed control signals are generated from values of the plurality of control signals based on a value of the even/odd leading signal.

6. The apparatus of claim 5, wherein the multiplexing control circuit is further configured to, responsive to the even odd leading signal having a first value, map the plurality of control signals to the plurality of multiplexed control signals in an inverted order.

7. The apparatus of claim 5, wherein the multiplexing control circuit is configured to, responsive to the even odd leading signal having a first value:
    map a first subset of the plurality of control signals to a last subset of the plurality of multiplexed control signals in an inverted order;
    map a middle subset of the plurality of control signals directly to a middle subset of the plurality of multiplexed control signals; and map a last subset of the plurality of control signals to a first subset of the plurality of multiplexed control signals in an inverted order.

8. The apparatus of claim 5, wherein the multiplexing control circuit is configured to, responsive to the even/odd leading signal having a second value, map the plurality of control signals directly to the plurality of multiplexed control signals.

9. The apparatus of claim 1, wherein a first of the first signal drivers has a different drive strength than a last of the first signal drivers, and a first of the second signal drivers has a different drive strength than a last of the second signal drivers.

10. The apparatus of claim 1, wherein:
a first subset of the first signal drivers have one or more different drive strengths, a middle subset of the first signal drivers have an equal drive strength, and a remaining subset of the first signal drivers have one or more different drive strengths; and
a first subset of the second signal drivers have one or more different drive strengths, a middle subset of the second signal drivers have an equal drive strength, and a remaining subset of the second signal drivers have one or more different drive strengths.

11. The apparatus circuit of claim 1, wherein each of the first signal drivers has a different drive strength, and each of the second signal drivers has a different drive strength.

12. An apparatus comprising:
a delay circuit configured to receive an input signal and to provide an output signal that is delayed relative to the input signal, the delay circuit comprising:
a coarse delay circuit configured to provide a first signal and a second signal based on the input signal;
a fine delay circuit configured to receive the first signal and the second signal, the fine delay circuit configured to provide the output signal based on a ratio of the first signal and the second signal via a plurality of signal drivers, wherein at least two of the plurality of signal drivers have different drive strengths, wherein the fine delay circuit further comprises a multiplexing control circuit configured to control the plurality of signal drivers via a plurality of multiplexed control signals; and
a controller configured to provide a plurality of control signals and a leading signal to the multiplexing control circuit, wherein the multiplexing control circuit maps the plurality of control signals to the plurality of multiplexed control signals based on a value of the leading signal.

13. The apparatus of claim 12, wherein the multiplexing control circuit is configured to, responsive to the leading signal having a first value, map the control signals to the plurality of multiplexed control signals, wherein at least a first subset of the plurality of control signals corresponds to a last subset of the plurality of multiplexed control signals.

14. The apparatus of claim 12, wherein one or more of a first subset of the plurality of signal drivers are configured to provide the first signal and one or more of a second subset of the plurality of signal drivers are configured to provide the second signal, wherein at least two signal drivers of the first subset of the plurality of signal drivers have different drive strengths, and wherein at least two signal drivers of the second subset of the plurality of signal drivers have different drive strengths.

15. The apparatus of claim 12, wherein the fine delay circuit further comprises a base interpolation circuit configured to provide each of the first input signal and the second input signal having a one-to-one ratio to the output node.

16. A method comprising:
receiving a plurality of control signals
mapping the plurality of control signals to a plurality of multiplexed control signals based on which of a first input signal and a second input signal is leading; and
mixing the first signal and the second signal at a phase mixer circuit to produce an output signal at an output node, wherein the phase mixer circuit comprises at least two signal drivers having different drive strengths.

17. The method of claim 16, wherein mixing the first signal and the second signal at a phase mixer circuit comprises:
providing the first signal to the output node via one or more of a first plurality of signal drivers of the phase mixer circuit, wherein at least two of the first plurality of signal drivers have a different drive strengths; and
providing the second signal to the output node via one or more of a second plurality of signal drivers of the phase mixer circuit, wherein at least two of the second plurality of signal drivers have a different drive strengths.

18. The method of claim 17, further comprising:
selecting the one or more of the first plurality of signal drivers and the one or more of the second plurality of signal drivers based on the plurality of multiplexed control signals.

19. The method of claim 17, wherein a multiplexed control signal of the plurality of multiplexed control signals is associated with a single signal driver of the first plurality of signal drivers and a single signal driver of the second plurality of signal drivers, wherein the single signal driver of the second plurality of signal drivers receives a complement of the multiplexed control signal.

* * * * *

UNITED STATES PATENT AND TRADEMARK OFFICE
CERTIFICATE OF CORRECTION

PATENT NO.         : 8,917,132 B2                                    Page 1 of 1
APPLICATION NO.    : 13/793627
DATED              : December 23, 2014
INVENTOR(S)        : Yantao Ma et al.

It is certified that error appears in the above-identified patent and that said Letters Patent is hereby corrected as shown below:

In the Claims

In column 10, line 49, in Claim 5, delete "even odd" and insert -- even/odd --, therefor.

In column 10, lines 55-56, in Claim 6, delete "even odd" and insert -- even/odd --, therefor.

In column 10, line 60, in Claim 7, delete "even odd" and insert -- even/odd --, therefor.

Signed and Sealed this
Twenty-fourth Day of March, 2015

Michelle K. Lee
*Director of the United States Patent and Trademark Office*